(12) United States Patent
Zhao et al.

(10) Patent No.: US 9,935,127 B2
(45) Date of Patent: Apr. 3, 2018

(54) CONTROL CIRCUIT OF THIN FILM TRANSISTOR

(71) Applicant: Wuhan China Star Optoelectronics Technology Co., Ltd., Wuhan (CN)

(72) Inventors: Mang Zhao, Wuhan (CN); Gui Chen, Wuhan (CN); Yong Tian, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 66 days.

(21) Appl. No.: 14/783,870

(22) PCT Filed: Aug. 21, 2015

(86) PCT No.: PCT/CN2015/087758
§ 371 (c)(1),
(2) Date: Oct. 12, 2015

(87) PCT Pub. No.: WO2017/016009
PCT Pub. Date: Feb. 2, 2017

(65) Prior Publication Data
US 2017/0033127 A1    Feb. 2, 2017

(30) Foreign Application Priority Data

Jul. 29, 2015    (CN) .......................... 2015 1 0454000

(51) Int. Cl.
*H01L 29/417*    (2006.01)
*H01L 27/12*    (2006.01)
(Continued)

(52) U.S. Cl.
CPC ........ *H01L 27/1222* (2013.01); *H01L 27/092* (2013.01); *H01L 27/124* (2013.01);
(Continued)

(58) Field of Classification Search
CPC ............ G02F 1/136209; G02F 1/1368; G02F 1/133509; G02F 1/133512;
(Continued)

(56) References Cited

U.S. PATENT DOCUMENTS 6,344,885 B1    2/2002    Mori et al.
7,161,176 B2 *    1/2007    Yamazaki ........... G02F 1/13454
257/59
(Continued)

FOREIGN PATENT DOCUMENTS

CN    101192622    6/2008
CN    101663758    3/2010
(Continued)

*Primary Examiner* — Maliheh Malek

(57) ABSTRACT

A control circuit of a thin film transistor, comprising: a substrate; a silicon nitride layer disposed on the substrate; a silicon dioxide layer disposed on the silicon nitride layer; a light shielding layer disposed inside the silicon nitride layer, which comprising a first light shielding region and a second light shielding region; at least one N type metal oxide semiconductor disposed on the silicon dioxide layer at a position corresponding to the first light shielding region; at least one P type metal oxide semiconductor disposed on the silicon dioxide layer at a position corresponding to the second light shielding region; each of the N type metal oxide semiconductor and the P type metal oxide semiconductor has a gate electrode layer, a first control signal received by voltage pulses of the gate electrode layer synchronized with a second control signal received by the light shielding layer in voltage variation.

8 Claims, 10 Drawing Sheets

(51) Int. Cl.
*H01L 29/786* (2006.01)
*H01L 27/092* (2006.01)
*H03K 5/135* (2006.01)
*H01L 27/32* (2006.01)

(52) U.S. Cl.
CPC ...... *H01L 27/1225* (2013.01); *H01L 27/1248* (2013.01); *H01L 29/41733* (2013.01); *H01L 29/78603* (2013.01); *H01L 29/78606* (2013.01); *H01L 29/78633* (2013.01); *H01L 29/78648* (2013.01); *H01L 29/78675* (2013.01); *H03K 5/135* (2013.01)

(58) Field of Classification Search
CPC ......... G02F 1/136286; G02F 1/134309; G02F 2201/123; G02F 2001/13629; H01L 29/41733; H01L 29/78606; H01L 29/78633; H01L 29/78672; H01L 29/78675; H01L 27/092; H01L 27/0922; H01L 27/0928; H01L 21/8238
See application file for complete search history.

(56) References Cited

U.S. PATENT DOCUMENTS

| | | | | |
|---|---|---|---|---|
| 9,647,009 | B1* | 5/2017 | Zhao | H01L 27/1248 |
| 9,651,815 | B2* | 5/2017 | Yu | G02F 1/13338 |
| 9,671,646 | B1* | 6/2017 | Tang | G02F 1/133621 |
| 2002/0153569 | A1 | 10/2002 | Katayama | |
| 2003/0076282 | A1* | 4/2003 | Ikeda | G09G 3/3648 |
| | | | | 345/55 |
| 2006/0231858 | A1* | 10/2006 | Akimoto | H01L 27/124 |
| | | | | 257/140 |
| 2006/0246360 | A1* | 11/2006 | Hwang | H01L 27/1214 |
| | | | | 430/5 |
| 2007/0002194 | A1 | 1/2007 | Shin | |
| 2007/0103608 | A1* | 5/2007 | Lee | G02F 1/13454 |
| | | | | 349/38 |
| 2008/0062112 | A1* | 3/2008 | Umezaki | G09G 3/342 |
| | | | | 345/100 |
| 2008/0121892 | A1 | 5/2008 | Tseng et al. | |
| 2009/0134461 | A1* | 5/2009 | Nagasawa | G02F 1/133555 |
| | | | | 257/350 |
| 2010/0065851 | A1 | 3/2010 | Makita | |
| 2010/0079425 | A1* | 4/2010 | Yamazaki | H01L 27/1214 |
| | | | | 345/206 |
| 2010/0109708 | A1* | 5/2010 | Koyama | H01L 27/1225 |
| | | | | 326/96 |
| 2011/0199564 | A1* | 8/2011 | Moriwaki | G02F 1/136227 |
| | | | | 349/122 |
| 2012/0075270 | A1* | 3/2012 | Kitakado | G02F 1/133512 |
| | | | | 345/204 |
| 2012/0146043 | A1* | 6/2012 | Kitakado | G02F 1/13624 |
| | | | | 257/72 |
| 2012/0256184 | A1* | 10/2012 | Kaneko | H01L 29/78621 |
| | | | | 257/59 |
| 2014/0034949 | A1* | 2/2014 | Matsukura | H01L 29/78693 |
| | | | | 257/52 |
| 2015/0243685 | A1* | 8/2015 | Lee | H01L 29/7869 |
| | | | | 257/43 |
| 2015/0243689 | A1* | 8/2015 | Lee | H01L 27/1225 |
| | | | | 257/43 |
| 2015/0243723 | A1* | 8/2015 | Cho | H01L 27/124 |
| | | | | 257/43 |
| 2016/0035753 | A1 | 2/2016 | Liu et al. | |
| 2016/0064421 | A1* | 3/2016 | Oh | H01L 27/1222 |
| | | | | 257/43 |
| 2016/0064465 | A1* | 3/2016 | Oh | H01L 27/3262 |
| | | | | 257/43 |
| 2016/0307936 | A1* | 10/2016 | Shin | H01L 27/1251 |
| 2016/0372497 | A1* | 12/2016 | Lee | H01L 27/1255 |
| 2017/0017129 | A1* | 1/2017 | Zhao | G02F 1/136204 |
| 2017/0032744 | A1* | 2/2017 | Yoo | G09G 3/3406 |
| 2017/0155000 | A1* | 6/2017 | Moon | H01L 29/78606 |
| 2017/0160611 | A1* | 6/2017 | Xu | G02F 1/136209 |
| 2017/0168347 | A1* | 6/2017 | Li | G02F 1/133512 |
| 2017/0207251 | A1* | 7/2017 | Liu | H01L 27/1222 |
| 2017/0363922 | A1* | 12/2017 | Tang | G02F 1/136209 |

FOREIGN PATENT DOCUMENTS

| | | |
|---|---|---|
| CN | 103579115 | 2/2014 |
| TW | 505798 | 10/2002 |

* cited by examiner

CONTROL CIRCUIT OF THIN FILM TRANSISTOR

RELATED APPLICATIONS

This application is a National Phase of PCT Patent Application No. PCT/CN2015/087758 having International filing date of Aug. 21, 2015, which claims the benefit of priority of Chinese Patent Application No. 201510454000.3, filed on Jul. 29, 2015. The contents of the above applications are all incorporated by reference as if fully set forth herein in their entirety.

TECHNICAL FIELD OF THE INVENTION

The present invention relates to a control circuit, and in particular to a control circuit of a thin film transistor having a metal light shielding layer.

BACKGROUND OF THE INVENTION

With the development of semiconductor low temperature polysilicon thin film transistors (LTPS TFT), and because of the ultrahigh carrier mobility characteristics of the semiconductor used in the LTPS TFT, the corresponding peripheral integrated circuits of a panel have become the focus of people's attention. A lot of manpower devote to the related technology of the system on the panel (System on Panel, SOP) research, and gradually make it become a reality. At the same time, due to the high mobility of the semiconductor elements of the LTPS TFT, its leakage characteristic becomes quite poor in comparison with the amorphous silicon (Amorphous silicon, a-si). The leakage current becomes an issue which is not negligible in the design of the LTPS TFT. Therefore, how to effectively control the leakage current of the LTPS TFT has become a problem in various panel designs.

In addition, in a general process of LTPS TFT panel design, a metal light shielding layer only has a function of shielding a back channel of a TFT device so as to reduce a photogenerated leakage current of the TFT device. Therefore, a utilization rate of the conventional metal light shielding layer is not high.

SUMMARY OF THE INVENTION

It is an object of the present invention to provide a control circuit of a thin film transistor, in order to solve problems of the channel will produce leakage current in the prior art when LCD display.

Another object of the present invention, under the premise of not changing the prior art of the metal function of the light shielding layer of the low temperature polysilicon thin film transistor process, is used the synchronous balance structure of the back channel of the light shielding and the front channel of the gate electrode layer to add the control circuit of the metal light shielding layer. By way of the light shielding layer control signal configured a drive signal of the gate electrode layer, increase the thin film transistor devices conductive current and reduce the leakage current of the device turn off.

Specific technical effect of the present invention is to provide a sufficient light shielding layer to improve the utilization of the mask. The present invention provides a layout diagram, in the thin film transistor (TFT) device which has voltage pluses with synchronous voltage variety, the metal light shielding layer corresponding to the synchronous voltage of the gate electrode layer, which are connected together by mask process, and then are connected a control signal. The present invention is under the premise of not changing the prior art of the metal function of the light shielding layer of the low temperature polysilicon thin film transistor process to add the control circuit of the metal light shielding layer. Further, it got the effective control of the thin film transistor (TFT) device back channel by controlling the metal light shielding layer. Under the voltage pluses with synchronous voltage variety, by way of the light shielding layer control signal configured a drive signal of the gate electrode layer, got increasing the thin film transistor devices conductive current and reducing the leakage current of the device turn off.

In order to solve the above question, The present invention provides a control circuit of a thin film transistor comprises: a substrate; a silicon nitride layer disposed on the substrate; a silicon dioxide layer disposed on the silicon nitride layer; a light shielding layer disposed inside the silicon nitride layer, the light shielding layer comprising a first light shielding region and a second light shielding region; at least one N type metal oxide semiconductor disposed on the silicon dioxide layer at a position corresponding to the first light shielding region; and at least one P type metal oxide semiconductor disposed on the silicon dioxide layer at a position corresponding to the second light shielding region; wherein each of the N type metal oxide semiconductor and the P type metal oxide semiconductor has a gate electrode layer, a first control signal received by voltage pulses of the gate electrode layer is synchronized with a second control signal received by the light shielding layer in voltage variation.

The N type metal oxide semiconductor comprises: an N type polysilicon layer disposed on the silicon dioxide layer; two N− type layers having inner sides thereof respectively joined to both outer sides of the N type polysilicon layer; two N+ type layers respectively joined to outer sides of the two N− type layers; a gate insulating layer disposed on the N type polysilicon layer, the two N− type layers, the two N+ type layers and the silicon dioxide layer; an inner dielectric layer disposed on the gate electrode layer, which is patterned, and the gate insulating layer; two through holes disposed through the inner dielectric layer and the gate insulating layer; and two source/drain electrodes, respectively connected with the N+ type layers of the N type metal oxide semiconductor via the through holes; wherein the gate insulating layer separates the gate electrode layer from the N type polysilicon layer of the N type metal oxide semiconductor, the N type polysilicon layer forms an N type front channel when the gate electrode layer of the N type metal oxide semiconductor is subjected to a high voltage.

A level of the second control signal applied to the second light shielding region is controlled to be higher than a level of the first control signal applied to the gate electrode layer by the synchronized voltage pulses in the N type metal oxide semiconductor, if a total thickness of the N type polysilicon layer, the silicon dioxide layer and the silicon nitride layer is less than a thickness of the gate insulating layer.

A level of the second control signal applied to the second light shielding region is controlled to be higher than a level of the first control signal applied to the gate electrode layer by the synchronized voltage pulses in the N type metal oxide semiconductor, if a total thickness of the N type polysilicon layer, the silicon dioxide layer and the silicon nitride layer is greater than a thickness of the gate insulating layer.

The P type metal oxide semiconductor comprises: a P type polysilicon layer disposed on the silicon dioxide layer; two P+ type layers respectively joined to the both outer sides of the P type layer; a gate insulating layer disposed on the P type polysilicon layer, the two P+ type layers and the silicon dioxide layer; an inner dielectric layer disposed on the gate electrode layer, which is patterned, and the gate insulating layer; two through holes disposed through the inner dielectric layer and the gate insulating layer; and two source/drain electrodes respectively connected with the P+ type layers of the P type metal oxide semiconductor via the through holes; wherein the gate insulating layer separates the gate electrode layer from the P type polysilicon layer of the P type metal oxide semiconductor, the P type polysilicon layer forms a P type front channel when the gate electrode layer of the P type metal oxide semiconductor is subjected to a low voltage.

A level of the second control signal applied to the second light shielding region is controlled to be lower than a level of the first control signal applied to the gate electrode layer by the synchronized voltage pulses in the P type metal oxide semiconductor, if a total thickness of the P type polysilicon layer, the silicon dioxide layer and the silicon nitride layer is less than a thickness of the gate insulating layer.

A level of the second control signal applied to the second light shielding region is controlled to be higher than a level of the first control signal applied to the gate electrode layer by the synchronized voltage pulses in the P type metal oxide semiconductor, if a total thickness of the P type polysilicon layer, the silicon dioxide layer and the silicon nitride layer is greater than a thickness of the gate insulating layer.

The control circuit of the thin film transistor, further comprises: an organic layer disposed on the P type metal oxide semiconductor and the N type metal oxide semiconductor; a bottom transparent conductive layer disposed on the organic layer, the organic layer used to isolate the bottom transparent conductive layer from the source/drain electrodes; a protection layer disposed on the organic layer, the bottom transparent conductive layer and an metal layer; and a top transparent conductive layer disposed on the protection layer, the top transparent conductive layer disposed through the protection layer and the organic layer, then electrically connected to the source/drain electrodes, the protection layer used to isolate the bottom transparent conductive layer from the top transparent conductive layer.

A control circuit of a common gate as reducing device leakage current, comprises any one of the control circuit of the thin film transistor description above, comprises an N type control circuit or a P type control circuit; wherein the N type control circuit, comprises: a gate line connected to the gate electrode layer of each N type metal oxide semiconductor to provide the first control signal; a light shielding layer control line used for connecting each first light shielding region to provide the second control signal; an N type light shielding layer control signal generating unit, connected the light shielding layer control line to generate the second control signal; and at least one data line, respectively connected to a source/drain electrode the of the N type metal oxide semiconductor; the respective connected gate electrode layer voltage pulse synchronized controlled by the gate line and the respective connected light shielding layer voltage pulse synchronized controlled by the N type light shielding layer control signal generating unit; wherein the P type control circuit, comprises: the gate line connected to the gate electrode layer of each P type metal oxide semiconductor to provide the first control signal; the light shielding layer control line used for connecting with each second light shielding region to provide the second control signal; a P type light shielding layer control signal generating unit, connected the light shielding layer control line to generate the second control signal; and at least one data line, respectively connected to the source/drain electrode the of the P type metal oxide semiconductor; the respective connected gate electrode layer voltage pulse synchronized controlled by the gate line and the respective connected light shielding layer voltage pulse synchronized controlled by the P type light shielding layer control signal generating unit.

A control circuit of a common gate as reducing device leakage current used in plurality of clock synchronization regions, comprises any one of the control circuit of the thin film transistor which are configured at different clock region description above, which have a multi-clock region control circuit, or a buffer control circuit, comprises: the multi-clock region control circuit, comprises: at least one gate line, each of the gate lines connected the gate electrode layer of at least one P type metal oxide semiconductor and the gate electrode layer of at least one N type metal oxide semiconductor in the same clock synchronization region, each gate line transmitting a synchronized first control signal; at least one light shielding layer control line used to being respectively connected with the first light shielding region of at least one P type metal oxide semiconductor and the second light shielding region of at least one N type metal oxide semiconductor in the same clock synchronization region; and at least one synchronous region light shielding layer control signal generating unit correspondingly connected with the respective light shielding layer control line in the same clock synchronization region, for generating a second control signal to provide the synchronized second control signal to every light shielding layer control line in the same clock synchronization region; wherein in the same clock synchronization region, the first control signal of the connected gate electrode layer provided by the gate line, and the second control signal applied to the light shielding layer by the light shielding layer control signal generating unit are synchronized with each other; wherein the buffer control circuit, comprises: a first inverter, the first inverter comprises: the N type metal oxide semiconductor connected the P type metal oxide semiconductor, wherein one end of the first inverter being an input end which is formed by the gate line connected with the gate electrode layer of the N type metal oxide semiconductor and the gate electrode layer of the P type metal oxide semiconductor, the other end of the first inverter being an output end which is formed by the gate line connected with the source/drain electrode of the N type metal oxide semiconductor and the source/drain electrode of the P type metal oxide semiconductor; a second inverter, the second inverter comprises: another the N type metal oxide semiconductor connected to another the P type metal oxide semiconductor, one end of the second inverter being an input end which is formed by the gate line connected with the gate electrode layer of another the N type metal oxide semiconductor and the gate electrode layer of another the P type metal oxide semiconductor, the input end of the second inverter connected the output end of the first inverter, the other end of the second inverter being an output end which is formed by the gate line connected with the source/drain electrode of another the N type metal oxide semiconductor and the source/drain electrode of another the P type metal oxide semiconductor; a first voltage line connected to the first inverter and the second inverter for being connected a high voltage source; and a second voltage line connected to the first inverter and the second inverter for being connected a low voltage source; wherein the synchronous region light shielding layer control signal generating unit comprises a first synchronous region signal control generating unit of the first inverter, and a second synchronous region signal control generating unit of the second inverter, the first synchronous region signal control generating unit controlling the second control signal of the light shielding layer of the first inverter, the second synchronous region signal control generating unit controlling the second control signal of the light shielding layer of the second inverter, the first inverter controlled in a first clock synchronization region, the second inverter controlled in a second clock synchronization region, the first synchronous region signal control generating unit connected the first light shielding region of the P type metal oxide semiconductor of the first inverter and the second light shielding region of the N type metal oxide semiconductor of the first inverter by the light shielding layer control line in the first clock synchronization region, the second synchronous region signal control generating unit connected the first light shielding region of the P type metal oxide semiconductor of the second inverter and the second light shielding region of the N type metal oxide semiconductor of the second inverter by the other light shielding layer control line in the second clock synchronization region; in the first clock synchronization region, the first control signal of the gate electrode layer of the first inverter and the second control signal of the first synchronous region signal control generating unit, which are controlled to be voltage pluses varying synchronously, so as to reduce device leakage current; in the second clock synchronization region, the first control signal of the gate electrode layer of the second inverter and the second control signal of the second synchronous region signal control generating unit, which are controlled to be voltage pluses varying synchronously, so as to reduce device leakage current.

To make the above description of the present invention to be more clearly comprehensible, preferred embodiments below which are accompanied with figures are described in detail as follows:

DETAILED DESCRIPTION OF THE INVENTION

The following descriptions of the respective embodiments are described with reference to the appended drawings to exemplarily illustrate practicable specific embodiments of the invention.

Figure 1:
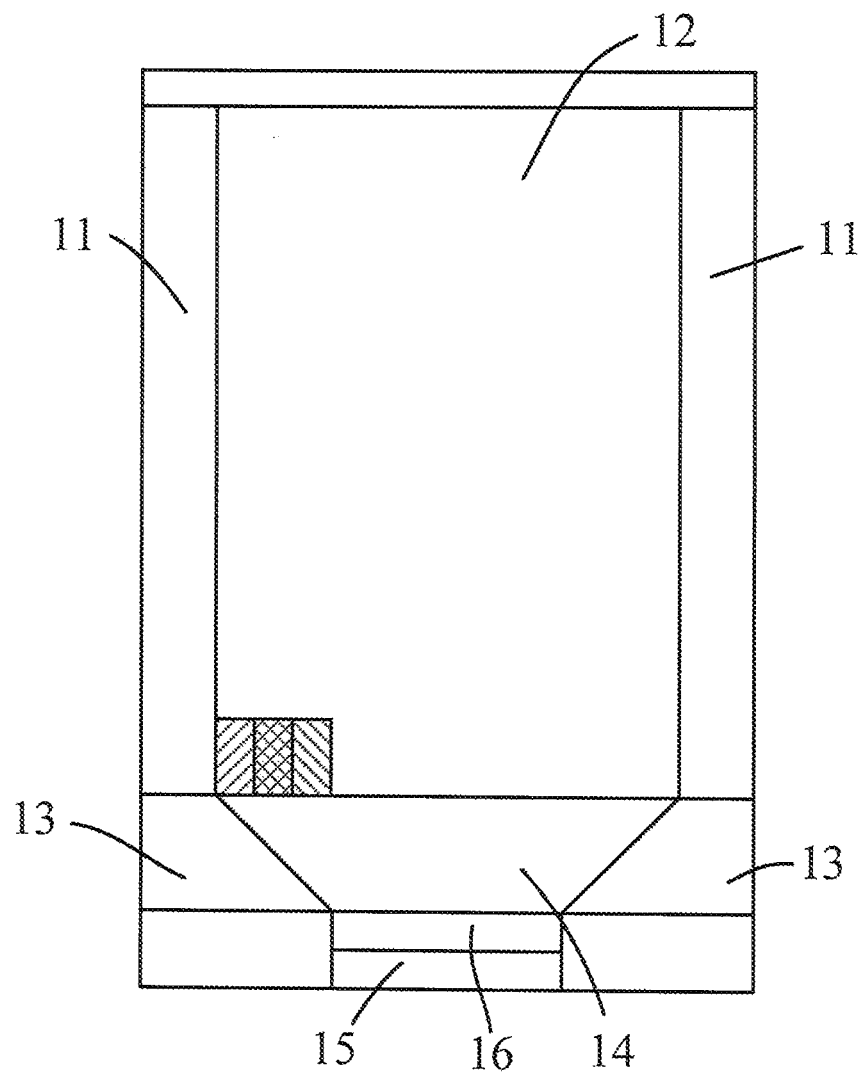
FIG. 1 is a schematic diagram of an assembled panel.

Please refer to FIG. 1, which shows a structure of areas of an assembled panel. The panel comprises: a pixel display area 12, an array gate region 11 (gate on array, GOA), a fanout region 14, a periphery wiring region 13 (wire on Array, WOA), an integrated circuit region 16, a flexible print circuit region 15 (FPC). The pixel display area 12 is used for displaying of the pixels. The array gate region 11 is used for generating a gate driving signal for a gate electrode layer 208 of a thin film transistor in the panel. The fanout region 14 is used for connection and wiring of data lines 44 between the integrated circuit region 16 and the pixel display area 12. The periphery wiring region 13 is used for connection of periphery wires of the panel. The integrated circuit region 16 is to be bonded with an integrated circuit to drive circuits and thin film transistors (TFTs) in the panel. The FPC region 15 is used for bonding with an FPC, and being connected with a motherboard of a mobile phone via the FPC.

Figure 2:
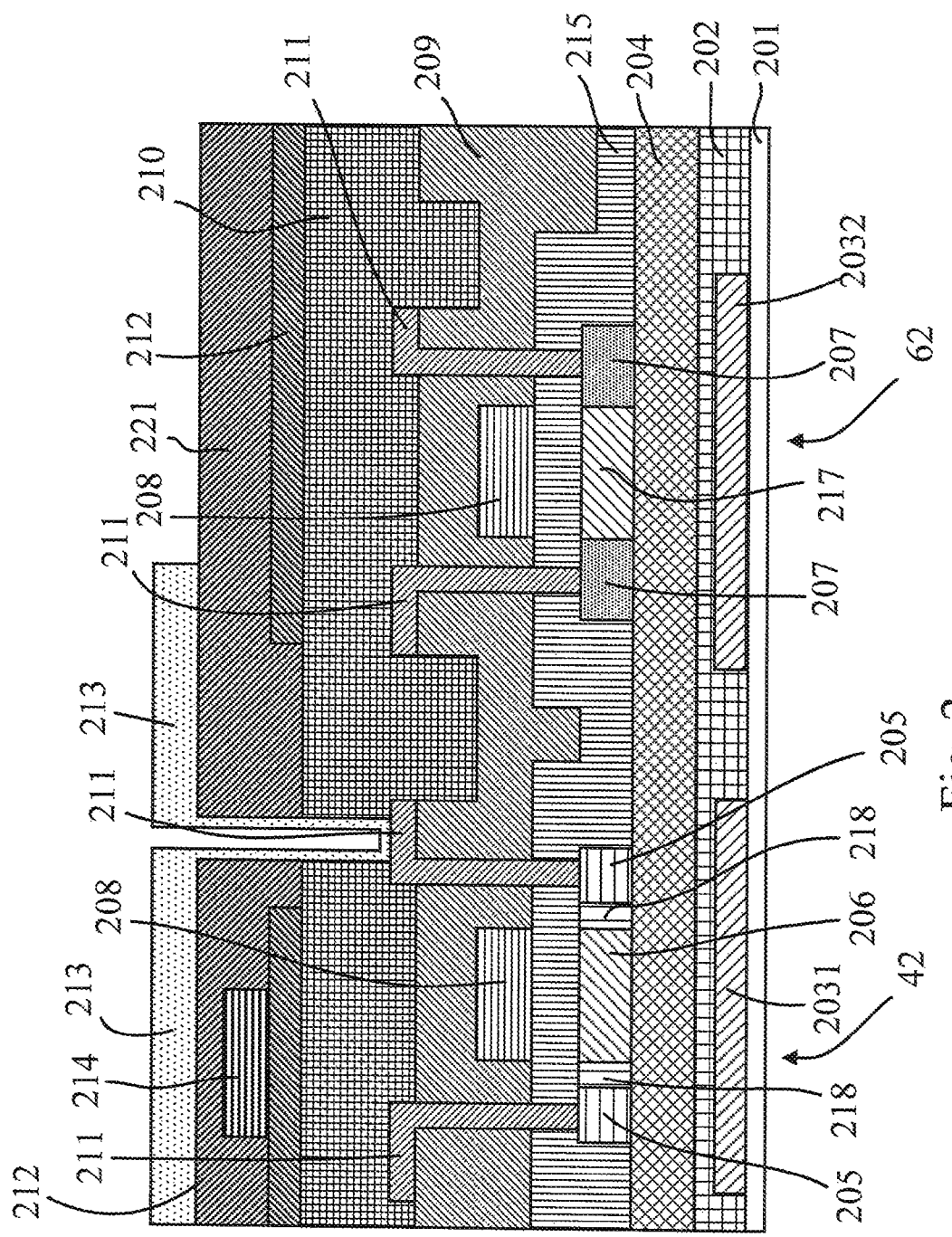
FIG. 2 is a schematic diagram shown a pixel structure of a low temperature polysilicon thin film transistor (LTPS TFT)

Please refer to FIG. 2, which is a diagram showing an advanced fringe field switching (AFFS) pixel structure of the low temperature polysilicon thin film transistor (LTPS TFT). The present invention provides an embodiment which is a control circuit of a thin film transistor in the pixel display area 12. The TFT is added with a control circuit of a metal light shielding layer without changing the original functions of the light shielding layer. The metal light shielding layer comprises a first light shielding region 2031 and a second light shielding region 2032. The metal light shielding layers of the thin film transistor devices, the voltage of which the voltages of gate electrode layers 208 are the same, are connected together by a mask design, and then are connected to a control signal. The control signal is used for controlling the voltage of the light shielding layer, and the waveform thereof changes the same as the signal of the gate electrode layer 208 to achieve synchronization.

Please refer to FIG. 2, the present invention provides a control circuit of a thin film transistor, which comprises: a substrate 201; a silicon nitride layer 202 (SiNx) disposed on the substrate; a silicon dioxide layer 204 ($SiO_2$) disposed on the silicon nitride layer 202; a light shielding layer, which comprises a first light shielding region 2031 and a second light shielding region 2032, disposed inside the silicon nitride layer 202; at least one N type metal oxide semiconductor (NMOS) 42 disposed on the silicon dioxide layer 204 at a position corresponding to the first light shielding region 2031; and at least one P type metal oxide semiconductor (PMOS) 62 disposed on the silicon dioxide layer 204 at a position corresponding to the second light shielding region 2032. Each of the NMOS 42 and the PMOS 62 has a gate electrode layer 208 as a circuit switch to control a first control signal received by voltage pulses of the gate electrode layer 208 to be synchronized with a second control signal received by the light shielding layer in voltage variation, so as to reduce device leakage current.

Please refer to FIG. 2, the NMOS 42 comprises: an N type polysilicon layer 206 disposed on the silicon dioxide layer 204; two N− type layers 218 having inner sides thereof respectively joined to both outer sides of the N type polysilicon layer 206; two N+ type layers 205 respectively joined to outer sides of the two N− type layers 218; a gate insulating layer 215 disposed on the N type polysilicon layer 206, the two N− type layers 218, the two N+ type layers 205 and the silicon dioxide layer 204; an inner dielectric layer 209 disposed on the gate electrode layer 208, which has been patterned, and the gate insulating layer 215; two through holes disposed through the inner dielectric layer 209 and the gate insulating layer 215; and two source/drain electrodes 211 respectively connected with the N+ type layers 205 of the NMOS 42 via the through holes. The gate insulating layer 215 separates the gate electrode layer 208 from the N type polysilicon layer 206 of the N type metal oxide semiconductor. The N type polysilicon layer 206 forms an N type front channel when the gate electrode layer 208 of the NMOS 42 is subjected to a high voltage.

Please refer to FIG. 2. The PMOS 62 comprises: a P type polysilicon layer 217 disposed on the silicon dioxide layer 204; two P+ type layers 207 respectively joined to the both outer sides of the P type layer; a gate insulating layer 215 disposed on the P type polysilicon layer 217, the two P+ type layers 207 and the silicon dioxide layer 204; an inner dielectric layer 209 disposed on the gate electrode layer 208, which has been patterned, and the gate insulating layer 215; two through holes disposed through the inner dielectric layer 209 and the gate insulating layer 215; and two source/drain electrodes 211 respectively connected with the P+ type layers 207 of the PMOS 62 via the through holes. The gate insulating layer 215 separates the gate electrode layer 208 from the P type polysilicon layer 217 of the PMOS 62. The P type polysilicon layer 217 forms a P type front channel when the gate electrode layer 208 of the PMOS 62 is subjected to a low voltage.

When the circuit switch is turned on, the control signal of the light shielding layer forms a back channel as a conductive path to act together with the conductive layer of the front channel, so that conductive current of the source/drain electrode 211 increases. When the circuit switch is turned off, a conductive carrier of conductive paths of the front channel is repelled by the control signal of the gate electrode layer 208, and the control signal of the light shielding layer repels a conductive carrier of the conductive path of the back channel synchronously. By way of synchronous adjustment to the control signal of the light shielding layer, two exclusion effect of the front channel and the back channel are used to cause conductive carriers achieve a balance in a middle channel. Leakage current due to electrons is small in the middle channel, therefore an effective conductive path cannot be formed, thereby reducing the device leakage current. The conductive carriers of the PMOS 62 are holes, and the conductive carriers of the NMOS 42 are electrons.

Please refer to FIG. 2, the control circuit of the thin film transistor, further comprises: an organic layer 210 disposed on the PMOS 62 and the N type metal oxide semiconductor; a bottom transparent conductive layer 212 disposed on the organic layer 210, which is used to isolate the bottom transparent conductive layer 212 from the source/drain electrode 211; a protection layer 221 disposed on the organic layer 210, the bottom transparent conductive layer 212 and an third metal layer 214; and a top transparent conductive layer 213 disposed on the protection layer 221. The top transparent conductive layer 213 is disposed through the protection layer 221 and the organic layer 210, and then is electrically connected to the source/drain electrode 211. The protection layer 221 is used to isolate the bottom transparent conductive layer 212 from top transparent conductive layer 213.

Figure 3:
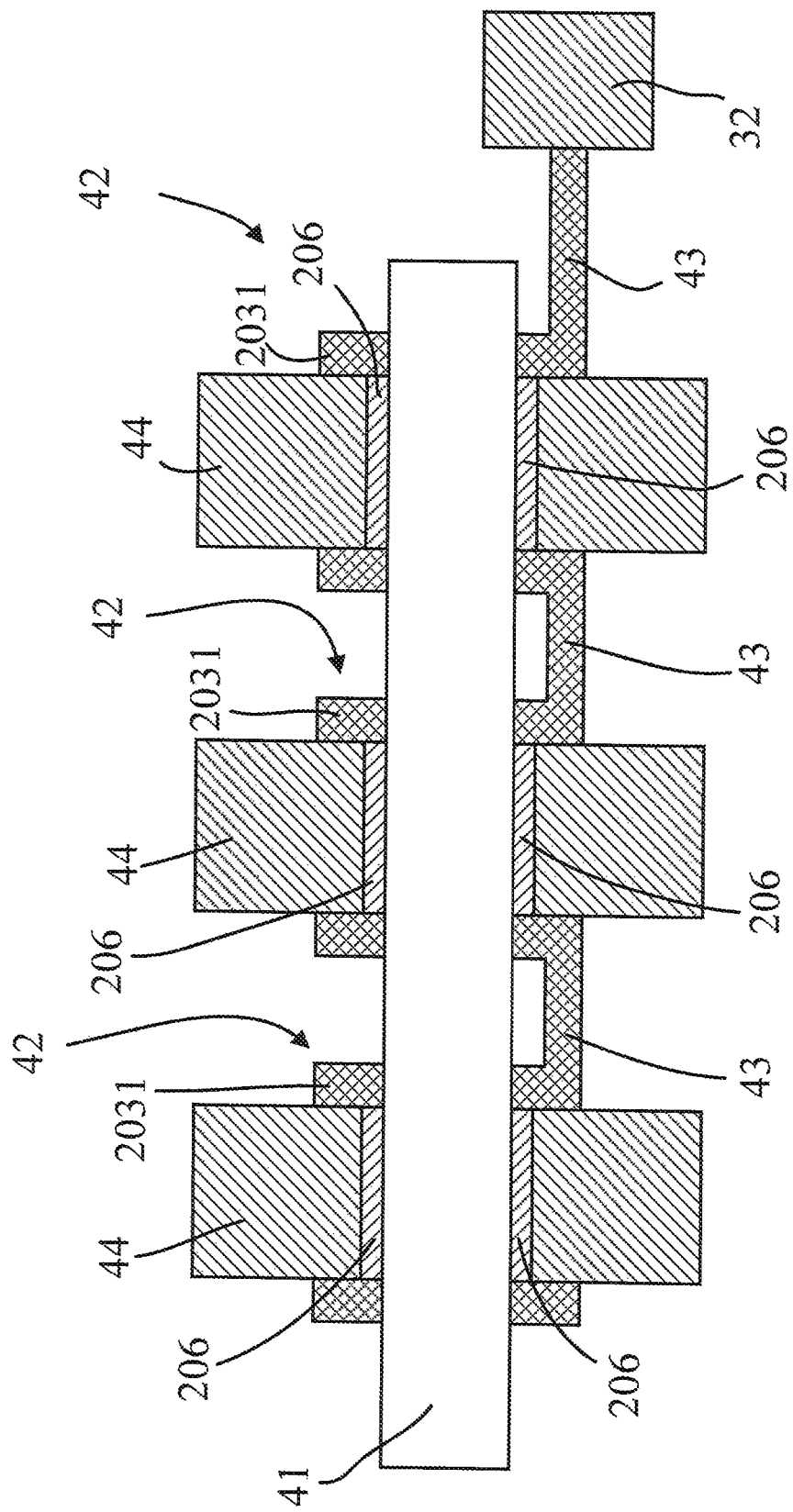
FIG. 3 shows a layout diagram of an N type metal oxide semiconductor control circuit.

Another embodiment of the invention, please refer to FIG. 3, the layout diagram of the NMOS 42 control circuit. Please refer to FIG. 4, which is a circuit diagram and a waveform diagram of the control circuit of the NMOS 42 in FIG. 3. The present invention provides a common gate leakage current reducing device control circuit for the control circuit of the thin film transistor, wherein an N type control circuit, comprises any one of the control circuit of the thin film transistor description above, comprises an N type control circuit or a P type control circuit. The N type control circuit comprises: a gate line 41 connected to the gate electrode layer 208 of each NMOS 42 to provide the first control signal; a light shielding layer control line 43 for connecting with each first light shielding region 2031 to provide the second control signal; an N type light shielding layer control signal generating unit 32 connected with the light shielding layer control line 43 to generate the second control signal; and at least one data line 44 respectively connected to the source/drain electrode 211 the of the N type metal oxide semiconductor. The voltage pulses of the gate electrodes 208 are connected with and synchronously controlled by the gate line 41. The voltage pulses of the light shielding layers are synchronously controlled by the N type light shielding layer control signal generating unit 32. The potential of the first control signal for the voltage pulses of the connected gate electrode 208 synchronously varies with that of the second control signal for the voltage pulses of the first light shielding region 2031, so as to reduce the device leakage current.

Figure 4:
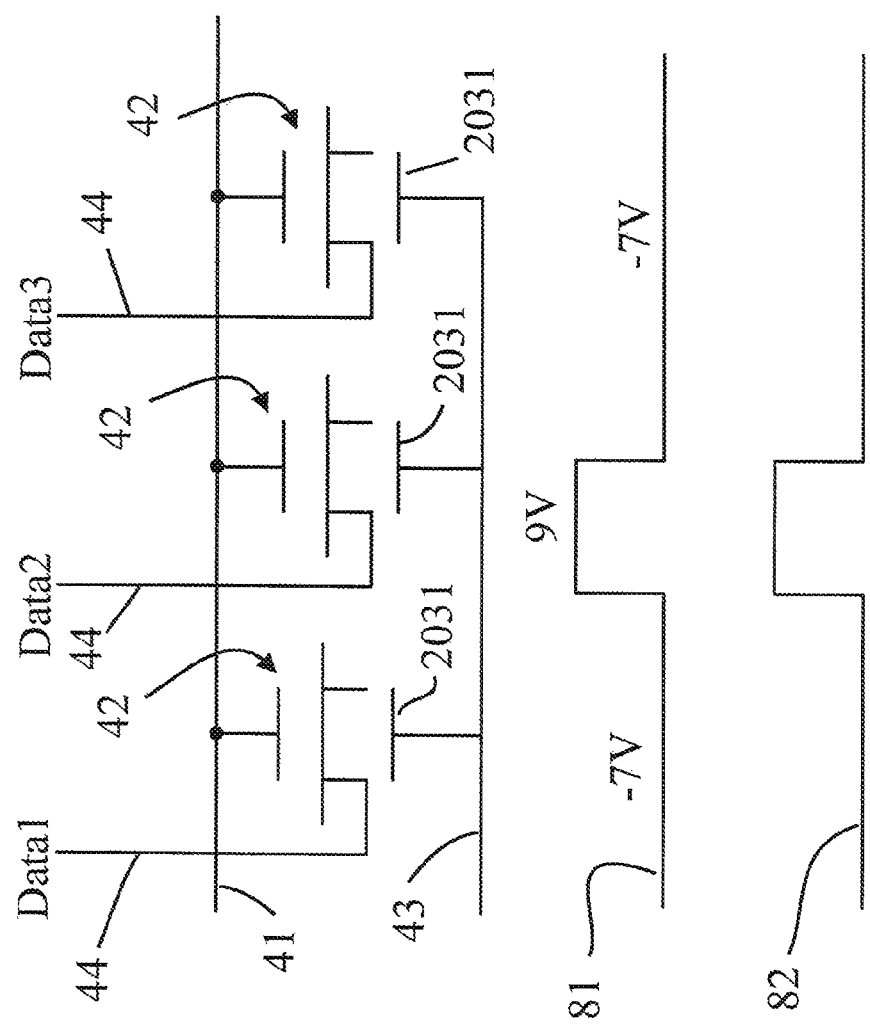
FIG. 4 shows a circuit and a waveform diagram of the N type metal oxide semiconductor control circuit in FIG. 3.

Please refer to FIG. 4, which shows a circuit diagram and a waveform diagram of the control circuit of the NMOS 42 in FIG. 3. A level of the second control signal applied to the second light shielding region 2032 is controlled to be lower than a level of the first control signal applied to the gate electrode layer 208 by the synchronized voltage pulses in the N type metal oxide semiconductor, if a total thickness of the N type polysilicon layer 206, the silicon dioxide layer 204 and the silicon nitride layer 202, is less than a thickness of the gate insulating layer 215. The level of the second control signal applied to the second light shielding region 2032 is controlled to be higher than the level of the first control signal applied to the gate electrode layer 208, if the total thickness of the N type polysilicon layer 206, the silicon dioxide layer 204, and the silicon nitride layer 202, is greater than the thickness of the gate insulating layer 215. Please refer to FIG. 4, the N type gate electrode layer control signal voltage 81 and the N type light shielding layer control signal voltage 82 are resulted from the first control signal for the voltage pulses of the connected gate electrode layer 208 and the second control signal for the voltage pulses of the connected respective first light shielding region 2031, which are controlled to vary synchronously, so as to reduce device leakage current.

Figure 5:
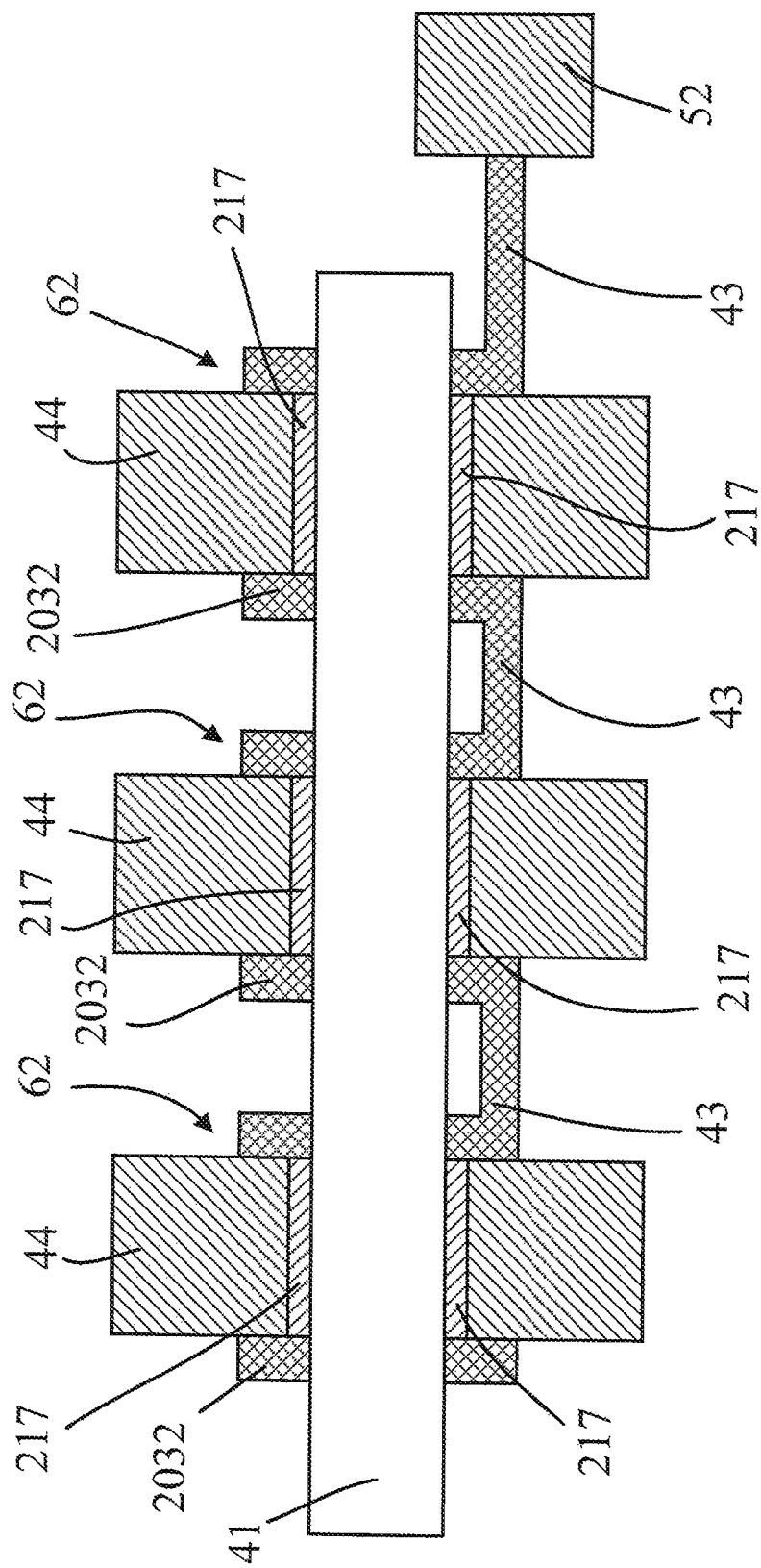
FIG. 5 is a P type metal oxide semiconductor control circuit layout diagram.

Another embodiment of the invention, please refer to FIG. 5, the layout diagram of the PMOS 62 control circuit is shown. Please refer to FIG. 6, which shows a circuit diagram and a waveform diagram of the control circuit of the NMOS 42 in FIG. 5. The present invention provides a common gate leakage current reducing device control circuit for the control circuit of the thin film transistor. A P type control circuit comprises: the gate line 41 connected to the gate electrode layer 208 of each PMOS 62 to provide the first control signal; the light shielding layer control line 43 used for connecting with each second light shielding region 2032 to provide the second control signal; a P type light shielding layer control signal generating unit 52 connected with the light shielding layer control line 43 to generate the second control signal; and at least one data line 44 respectively connected to the source/drain electrode 211 the of the PMOS 62. The voltage pulses of the gate electrodes 208 are connected with and synchronously controlled by the gate line 41. The voltage pulses of the light shielding layers are synchronously controlled by the P type light shielding layer control signal generating unit 52. The potential of the first control signal for the voltage pulses of the connected gate electrode 208 synchronously varies with that of the second control signal for the voltage pulses of the second light shielding region 2032, so as to reduce the device leakage current.

Figure 6:
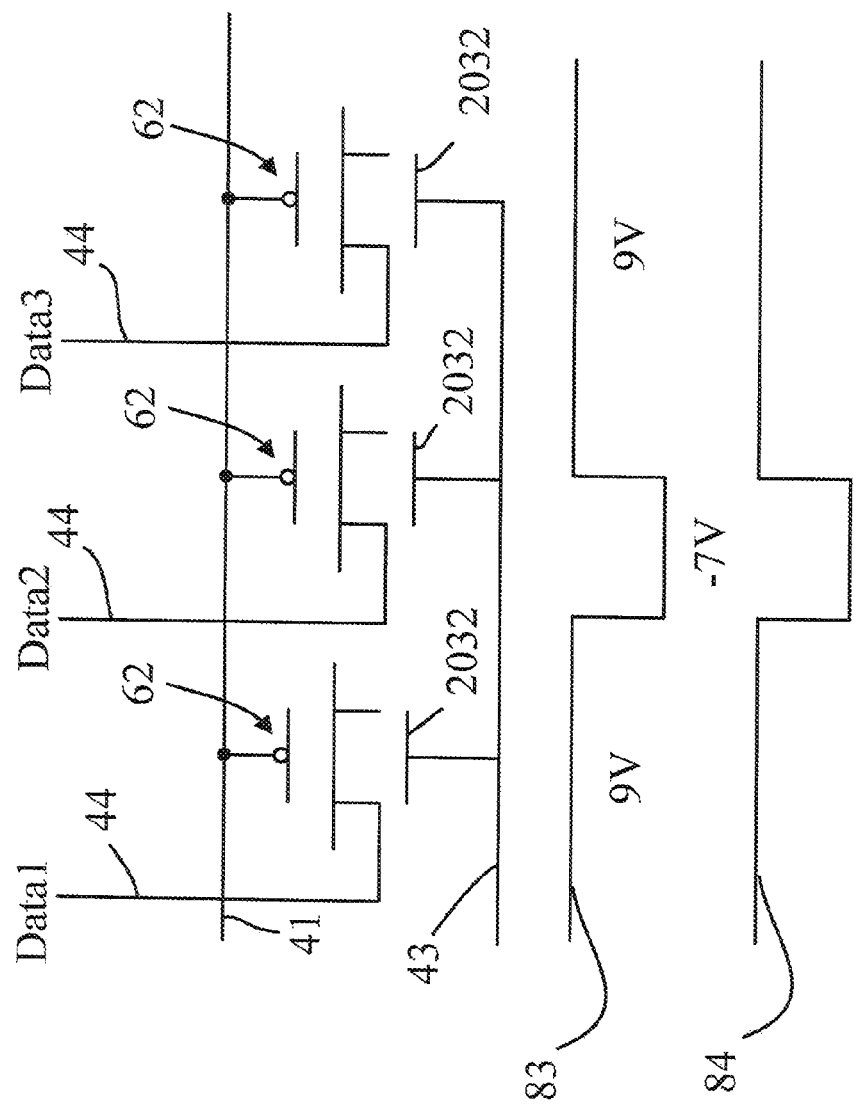
FIG. 6 is the circuit and a waveform diagram of a P type metal oxide semiconductor control circuit in FIG. 5.

Please refer to FIG. 6, which shows a circuit diagram and a waveform diagram of the control circuit of the PMOS 62 in FIG. 5. A level of the second control signal applied to the second light shielding region 2032 is controlled to be lower than a level of the first control signal applied to the gate electrode layer 208 by the synchronized voltage pulses in the PMOS 62, if the total thickness of the P type polysilicon layer 217, the silicon dioxide layer 204 and the silicon nitride layer 202 is less than the thickness of the gate insulating layer 215. The level of the second control signal applied to the second light shielding region 2032 is controlled to be higher than the level of the first control signal applied to the gate electrode layer 208 by the synchronized voltage pulses in the PMOS 62, if the total thickness of the P type polysilicon layer 217, the silicon dioxide layer 204 and the silicon nitride layer 202 is greater than the thickness of the gate insulating layer 215. Please refer to FIG. 6, the P type gate electrode layer control signal voltage 83 and the P type light shielding layer control signal voltage 84 are resulted from the first control signal for the voltage pulses of the connected gate electrode layer 208 and the second control signal for the voltage pulses of the connected respective second light shielding region 2032, which are controlled to vary synchronously, so as to reduce device leakage current.

In addition, the present invention is not limited to the gate line 41 which is only used for being connected to the gate electrode 208 of a plurality of the NMOS 42 in FIG. 4, and not limited to the gate line 41 which is only used for being connected to the gate electrode 208 of a plurality of PMOS 62 in FIG. 6. In another embodiment of the present invention, the gate line is used to being connected at least one NMOS 42 and at least one PMOS 62 simultaneously. The present invention provided a control circuit of a common gate used in a plurality of clock synchronization regions for reducing device leakage current. The control circuit of a thin film transistor mentioned above, comprises: at least one gate line 41, each of which is connected the gate electrode layer 208 of at least one PMOS 62 and the gate electrode layer 208 of at least one N type metal oxide semiconductor in the same clock synchronization region. Each gate line 41 transmits a synchronized first control signal. at least one light shielding layer control line 43 is further comprised to be respectively connected with a first light shielding region 2031 of at least one PMOS 62 and a second light shielding region 2032 of at least one NMOS 42 in the same clock synchronization region. At least one synchronous region light shielding layer control signal generating unit is further included to be correspondingly connected with the light shielding layer control line 43 in the same clock synchronization region, for generating a second control signal to provide the synchronized second control signal to every light shielding layer control line 43 in the same clock synchronization region. In the same clock synchronization region, the first control signal of the connected gate electrode layer 208 provided by the gate line 41, and the second control signal applied to the light shielding layer by the light shielding layer control signal generating unit are synchronized with each other, so as to reduce device leakage current.

Figure 9:
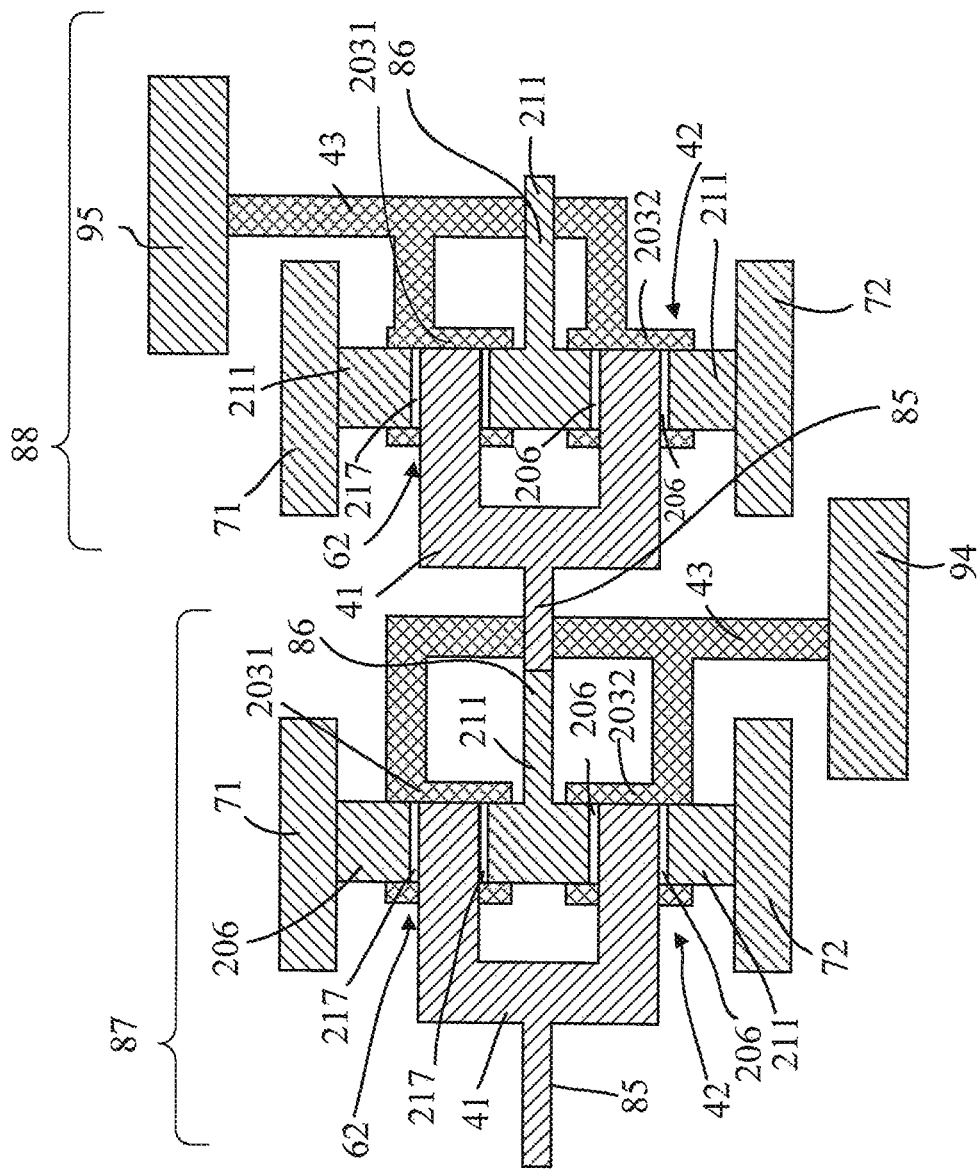
FIG. 9 is a circuit diagram of a buffer of a control circuit of the present invention circuit for reducing leakage current of a device, the buffer has two inverters connected with each other.

Please refer to FIG. 9, which is a circuit diagram of a buffer using a control circuit for reducing device leakage current. The buffer has two inverters. Please refer to FIG. 10, which shows a layout diagram of the buffer having two inverters in FIG. 9 of the present invention. The present invention provides a control circuit of a common gate for reducing device leakage current in plurality of clock synchronization regions, which acts as the buffer and comprises: a first inverter 87, and a second inverter 88. Please refer to the left side of FIG. 9 and FIG. 10, the PMOS 62 is shown at the upper left side, and the NMOS 42 is shown at the lower left side. One end of a first inverter 87 is an input end 85, which is formed by the gate lines 41, the other end of the first inverter 87 is an output end 86, which is formed by the source/drain electrodes 211 of the PMOS 62 and the source/drain electrodes 211 of the NMOS 42. Please refer to the right sides of FIG. 9 and FIG. 10, the PMOS 62 is shown at the upper right side, and the NMOS 42 is shown at the lower right side. One end of a second inverter 88 is an input end 85 which is formed by the gate lines 41 connected to the output end 86 of the first inverter 87, the other end of the second inverter 88 is an output end 86, which is formed by the source/drain electrode 211 of the PMOS 62 and the source/drain electrode 211 of the NMOS 42.

Please refer to FIG. 9, the first inverter 87 comprises the NMOS 42 connected to the PMOS 62. One end of the first inverter 87 is an input end 85 which is formed by the gate line 41 connected with the gate electrode layer 208 of the NMOS 42 and the gate electrode layer 208 of the PMOS 62, the other end of the first inverter 87 is an output end 86 which is formed by the gate line 41 connected with the source/drain electrode 211 of the NMOS 42 and the source/drain electrode 211 of the PMOS 62. The second inverter 88 comprises another the NMOS 42 connected to another the PMOS 62. One end of the second inverter 88 is an input end 85 which is formed by the gate line 41 connected with the gate electrode layer 208 of another the NMOS 42 and the gate electrode layer 208 of another the PMOS 62. The input end 85 of the second inverter 88 is connected to the output end 86 of the first inverter 87. The other end of the second inverter 88 is an output end 86 which is formed by the gate line 41 connected with the source/drain electrode 211 of another the NMOS 42 and the source/drain electrode 211 of another the PMOS 62. A first voltage line 71 is connected to the first inverter 87 and the second inverter 88 for being connected to a high voltage source. A second voltage line 72 is connected to the first inverter 87 and the second inverter 88 for being connected to a low voltage source. The synchronous region light shielding layer control signal generating unit comprises a first synchronous region signal control generating unit 94 of the first inverter 87, and a second synchronous region signal control generating unit 95 of the second inverter 88. The first synchronous region signal control generating unit 94 controls the second control signal of the light shielding layer of the first inverter 87, and the second synchronous region signal control generating unit 95 controls the second control signal of the light shielding layer of the second inverter 88. The first inverter 87 is controlled in a first clock synchronization region, and the second inverter 88 is controlled in a second clock synchronization region. The first synchronous region signal control generating unit 94 is connected with the first light shielding region 2031 of the PMOS 62 of the first inverter 87 and the second light shielding region 2032 of the NMOS 42 of the first inverter 87 by the light shielding layer control line 43 in the first clock synchronization region. The second synchronous region signal control generating unit 95 is connected with the first light shielding region 2031 of the PMOS 62 of the second inverter 88 and the second light shielding region 2032 of the NMOS 42 of the second inverter 88 by the other light shielding layer control line 43 in the second clock synchronization region. In the first clock synchronization region, the first control signal of the gate electrode layer 208 of the first inverter 87 and the second control signal of the first synchronous region signal control generating unit 94 are controlled to be voltage pluses varying synchronously, so as to reduce device leakage current. In the second clock synchronization region, the first control signal of the gate electrode layer 208 of the second inverter 88 and the second control signal of the second synchronous region signal control generating unit 95 are controlled to be voltage pluses varying synchronously, so as to reduce device leakage current.

Figure 10:
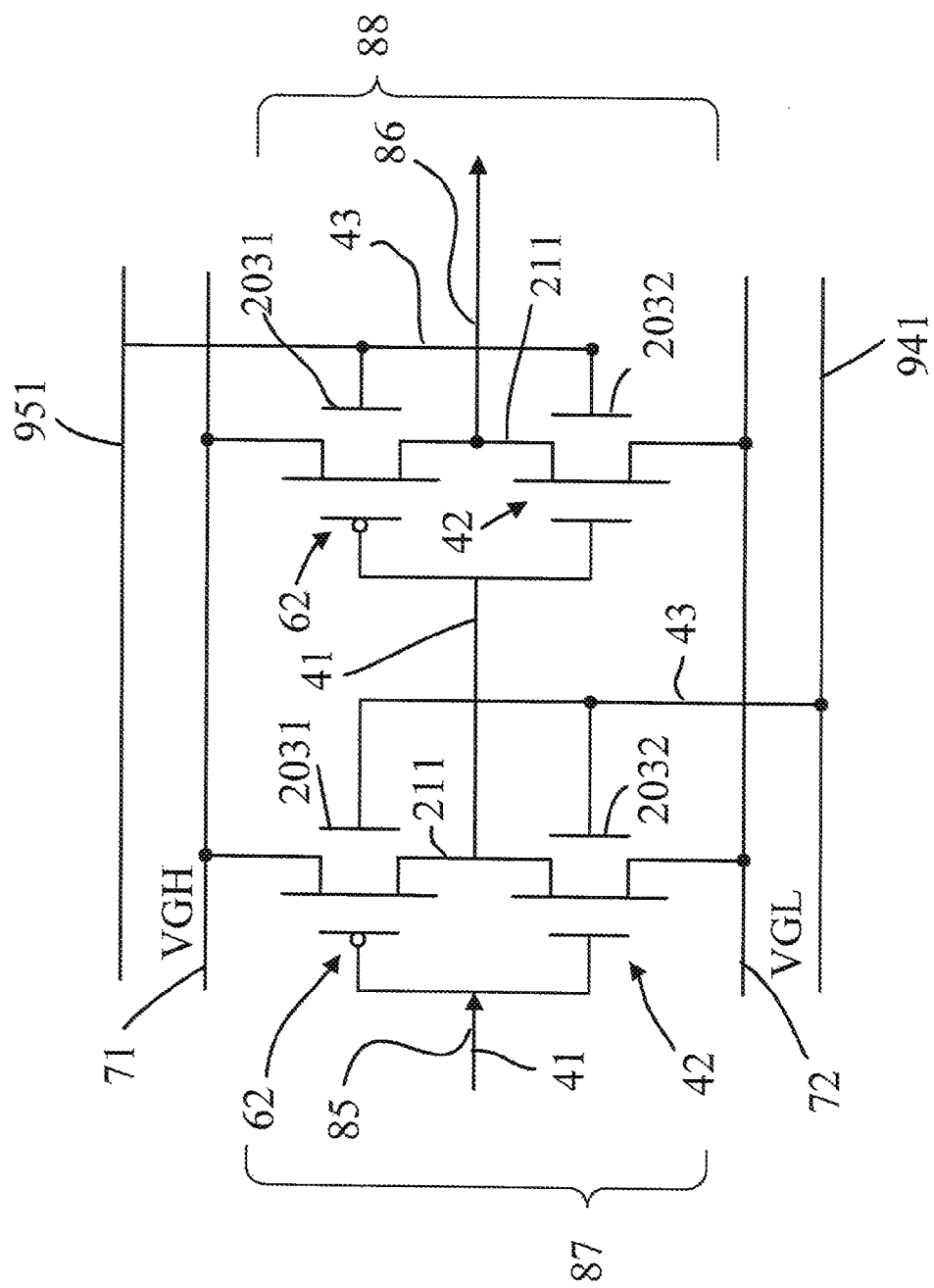
FIG. 10 is a layout diagram of the buffer having the two inverters connected with each other in accordance with the present invention shown in FIG. 9.

Please refer to FIG. 9 and FIG. 10, the first inverter 87 is configured to have the NMOS 42 and the PMOS 62 in FIG. 2. The first inverter 87 is controlled in the first clock synchronization region. The first inverter 87 comprises: a substrate; two light shielding layers disposed inside the silicon nitride layer 202 which disposed on the substrate 201; a silicon dioxide layer 204 disposed on the silicon nitride layer 202; one NMOS 42 disposed on the silicon dioxide layer 204 at a position corresponding to the first light shielding region 2031; and one PMOS 62 disposed on the silicon dioxide layer 204 at a position corresponding to the second light shielding region 2032. Each of the NMOS 42 and the PMOS 62 has a gate electrode layer 208, a gate line 41, the gate line 41 transmitting a synchronous signal in the same duty cycle of the first clock synchronization region. The gate line 41 is used to be connected to the gate electrode layer 208 of the NMOS 42 and the gate electrode layer 208 of the PMOS 62, and the light shielding layer control line 43 is used to be connected to the first light shielding region 2031 of the PMOS 62, and the second light shielding region 2032 of the NMOS 42 in the first clock synchronization region. The first synchronous region signal control generating unit 94 is further comprised to be correspondingly connected with the light shielding layer control line 43 in the first clock synchronization region. In FIG. 10, the first signal control line 941 is connected to the first synchronous region signal control generating unit 94, and the second signal control line 951 is connected to the second synchronous region signal control generating unit 95. The voltage of the input end 85 of the first inverter 87 is high, and the voltage of the output end 86 is low. The NMOS 42 is turned on, and the PMOS 62 is turned off. The voltage of the input end 85 of the first inverter 87 is low, and the voltage of the output end 86 is high. The NMOS 42 is turned off, and the PMOS 62 is turned on. Since in the first clock synchronization region, the first control signal of the gate electrode layer 208 of the first inverter 87 and the second control signal of the first synchronous region signal control generating unit 94 are controlled to be voltage pluses varying synchronously, so as to reduce device leakage current.

Please refer to FIG. 9 and FIG. 10, the second inverter 88 is configured to have the NMOS 42 and the PMOS 62 in FIG. 2, the second inverter 88 is controlled in the second clock synchronization region, the second inverter 88 comprises: a substrate 201; two light shielding layers (2031, 2032) disposed inside the silicon nitride layer 202 which disposed on the substrate 201; a silicon dioxide layer 204 disposed on the silicon nitride layer 202; one NMOS 42 disposed on the silicon dioxide layer 204 at a position corresponding to the first light shielding region 2031; and one PMOS 62 disposed on the silicon dioxide layer 204 at a position corresponding to the second light shielding region 2032. Each of the NMOS 42 and the PMOS 62 which has a gate electrode layer 208; a gate line 41, the gate line 41 transmitting a synchronous signal in the same duty cycle of the second clock synchronization region. The gate line 41 is used to be connected to the gate electrode layer 208 of the NMOS 42 and the gate electrode layer 208 of the PMOS 62, and the light shielding layer control line 43 is used to be connected to the first light shielding region 2031 of the PMOS 62, and the second light shielding region 2032 of the NMOS 42 in the second clock synchronization region.

The second synchronous region signal control generating unit 95 is further comprised to be correspondingly connected with the light shielding layer control line 43 in the second clock synchronization region. The voltage of the input end 85 of the second inverter 88 is high, The voltage of the output end 86 is low. The NMOS 42 is turned on, and the PMOS 62 is turned off. The voltage of the input end 85 of the first inverter 87 is low, and the voltage of the output end 86 is high. The NMOS 42 is turned off, and the PMOS 62 is turned on. Since in the second clock synchronization region, the first control signal of the gate electrode layer 208 of the second inverter 88 and the second control signal of the second synchronous region signal control generating unit 95 are controlled to be voltage pluses varying synchronously, so as to reduce device leakage current.

Figure 7:
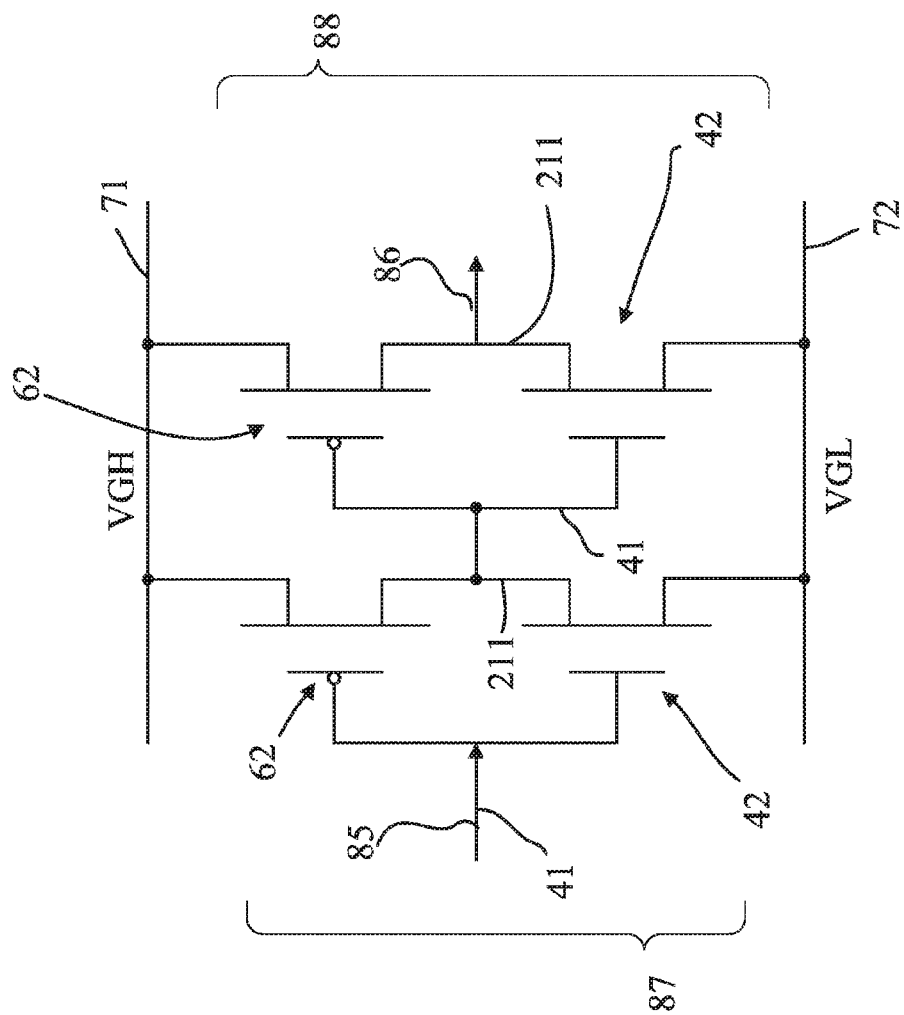
FIG. 7 is a circuit diagram of a conventional buffer having two inverters connected with each other.
Figure 8:
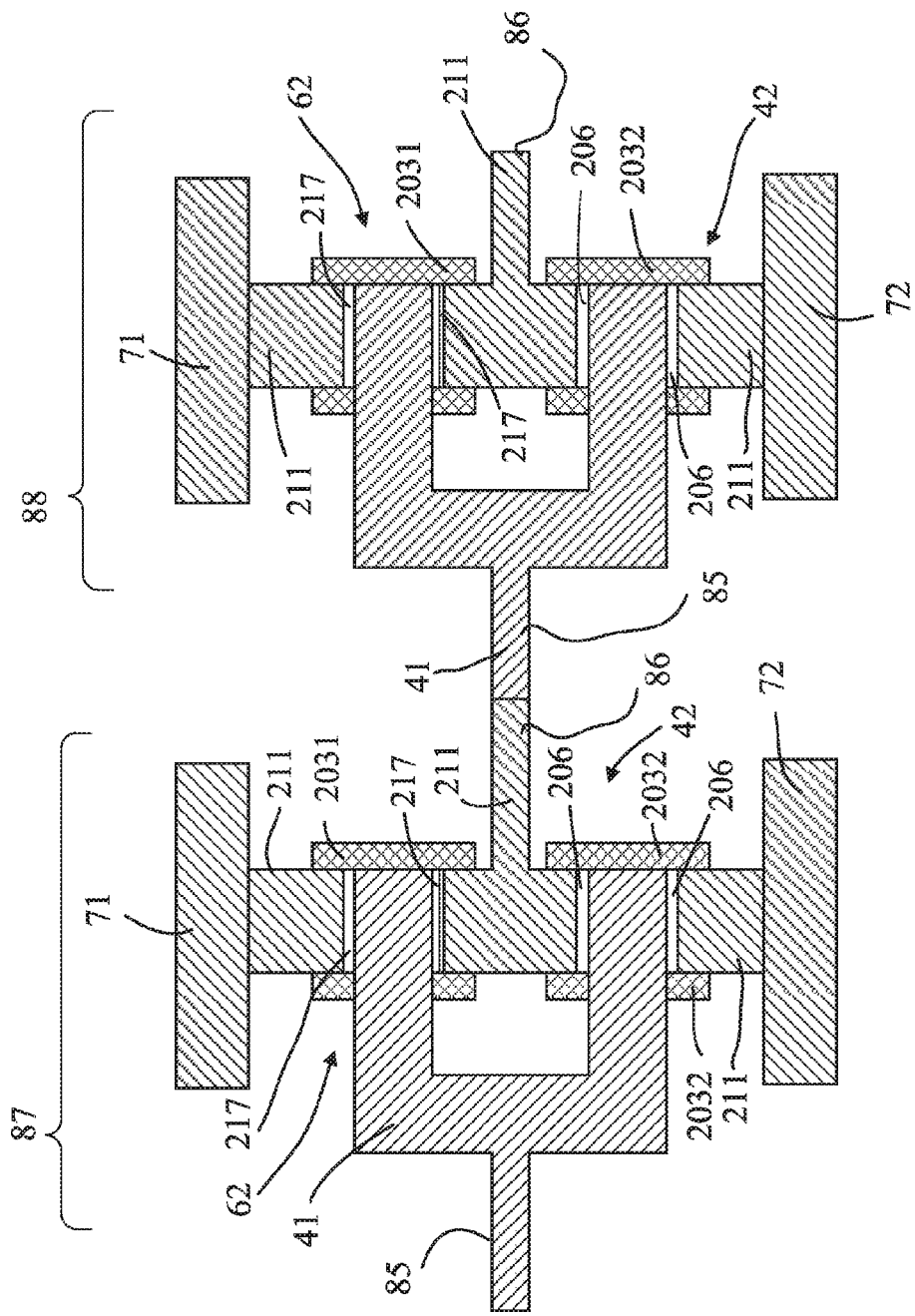
FIG. 8 is a layout diagram of the conventional buffer having the two inverters connected with each other shown in FIG. 7.

Compared with the present invention FIG. 9, please refer to FIG. 7 which is the circuit diagram of the present buffer having two inverters connected with each other. Compared with the present invention FIG. 10, please refer to FIG. 8 which is the layout diagram of the present buffer having two inverters connected with each other. According to the present invention, without changing the metal function of the light shielding layer (Light Shielding layer, LS) in the low temperature polysilicon thin film transistor process (as in the prior art FIGS. 7 and 8) as the prior art, control circuits for the metal light shielding layer are added. For example, the first synchronous region signal control generating unit 94, the second synchronous region signal control generating unit 95 and the light shielding layer control line 43 are added, with reference to FIG. 9, FIG. 10 of the present invention.

A first metal layer M1 is generally used as a mask for forming the gate line 41 and the gate electrode layer 208. A second metal layer M2 is generally used as a mask for the source/drain electrode 211, and the output end 86 connected with the first inverter 87 and the second inverter 88. However, it is not limited thereto.

The specific efficacy of the embodiments of the present invention is to provide that, in the same clock synchronization region, voltage pulses of the respective connected gate electrodes 208 are synchronously controlled by the gate line 41, and voltage pulses of the respective connected light shielding layers are synchronously controlled by the (N type or P type) light shielding layer control signal generating unit 32 or 52. The voltage pulses of the connected gate electrodes 208, and the voltage pulses of the respective connected light shielding layer control signal voltages are controlled to be varied synchronously. When the circuit switch is turned on, the control signal of the light shielding layer forms a back channel as a conductive path to act together with the conductive layer of the front channel, so that conductive current of the source/drain electrode 211 increases. When the circuit switch is turned off, conductive carriers of the conductive path of the front channel are repelled by the control signal of the gate electrode layer 208, and the control signal of the light shielding layer repels conductive carriers of the conductive path of the back channel synchronously. By way of synchronous adjustment of the control signal of the light shielding layer, two exclusion effects of the front channel and the back channel are used to cause the conductive carriers to achieve a balance in a middle channel. Leakage current due to electrons is smaller in the middle channel, therefore an effective conductive path cannot be formed, thereby reducing the device leakage current.

In summary, although the invention has been disclosed a preferred embodiment above, the above preferred embodiment of the present invention is not to limit the present invention, people who is ordinary skill in the art can made various modifications and variations without departing from the spirit and scope of the present invention, and therefore the protection scope of the invention defined by the scope of the claims.

What is claimed is:

1. A control circuit for reducing leakage current of a common gate device, comprising:
a substrate;
a silicon nitride layer disposed on the substrate;
a silicon dioxide layer disposed on the silicon nitride layer;
a light shielding layer disposed inside the silicon nitride layer, the light shielding layer comprising a first light shielding region and a second light shielding region;
at least one N type metal oxide semiconductor disposed on the silicon dioxide layer at a position corresponding to the first light shielding region; and
at least one P type metal oxide semiconductor disposed on the silicon dioxide layer at a position corresponding to the second light shielding region;
wherein each of the N type metal oxide semiconductor and the P type metal oxide semiconductor has a gate electrode layer, a first control signal received by voltage pulses of the gate electrode layer is synchronized with a second control signal received by the light shielding layer according to voltage variations of the first and second control signals;
wherein the control circuit further comprises an N type control circuit or a P type control circuit;
wherein the N type control circuit, comprises:
a gate line connected to the gate electrode layer of each N type metal oxide semiconductor to provide the first control signal;
a light shielding layer control line used for connecting each first light shielding region to provide the second control signal;
an N type light shielding layer control signal generating unit connected with the light shielding layer control line to generate the second control signal; and
at least one data line, respectively connected to a source/drain electrode of the N type metal oxide semiconductor;
the respective connected gate electrode layer voltage pulse synchronized controlled by the gate line and the respective connected light shielding layer voltage pulse synchronized controlled by the N type light shielding layer control signal generating unit;
wherein the P type control circuit, comprises:
a gate line connected to the gate electrode layer of each P type metal oxide semiconductor to provide the first control signal;
a light shielding layer control line used for connecting with each the second light shielding region to provide the second control signal;
a P type light shielding layer control signal generating unit, connected with the light shielding layer control line to generate the second control signal; and
at leak one data line, respectively connected to the source/drain electrode of the P type metal oxide semiconductor;
the respective connected gate electrode layer voltage pulse synchronized controlled by the gate line and the respective connected light shielding layer voltage pulse synchronized controlled by the P type light shielding layer control signal generating unit.

2. The control circuit for reducing leakage current of the common gate device according to claim 1, wherein the N type metal oxide semiconductor, comprises:
an N type polysilicon layer disposed on the silicon dioxide layer;
two N− type layers having inner sides thereof respectively joined to both outer sides of the N type polysilicon layer;
two N+ type layers respectively joined to outer sides of the two N− type layers;
a gate insulating layer disposed on the N type polysilicon layer, the two N− type layers, the two N+ type layers and the silicon dioxide layer;
an inner dielectric layer disposed on the gate electrode layer, which is patterned, and the gate insulating layer;
two through holes disposed through the inner dielectric layer and the gate insulating layer; and
two source/drain electrodes, respectively connected with the N+ type layers of the N type metal oxide semiconductor via the through holes;
wherein the gate insulating layer separates the gate electrode layer from the N type polysilicon layer of the N type metal oxide semiconductor, the N type polysilicon layer forms an N type front channel when the gate electrode layer of the N type metal oxide semiconductor is subjected to a high voltage;
wherein a level of the second control signal applied to the second light shielding region is controlled to be lower than a level of the first control signal applied to the gate electrode layer by the synchronized voltage pulses in the N type metal oxide semiconductor, if a total thickness of the N type polysilicon, the silicon dioxide layer and the silicon nitride layer is less than a thickness of the gate insulating layer;
wherein a level of the second control signal applied to the second light shielding region is controlled to be higher than a level of the first control signal applied to the gate electrode layer by the synchronized voltage pulses in the N type metal oxide semiconductor, if the total thickness of the N type polysilicon layer, the silicon dioxide layer and the silicon nitride layer is less than the thickness of the gate insulating layer.

3. The control circuit for reducing leakage current of the common gate device according to claim 1, wherein the P type metal oxide semiconductor, comprises:
a P type polysilicon layer disposed on the silicon dioxide layer;
two P+ type layers respectively joined to the both outer sides of the P type layer;
a gate insulating layer disposed on the P type polysilicon layer, the two P+ type layers and the silicon dioxide layer;
an inner dielectric layer disposed on the gate electrode layer, which is patterned, and the gate insulating layer;
two through holes disposed through the inner dielectric layer and the gate insulating layer; and
two source/drain electrodes, respectively connected with the P+ type layers of the P type metal oxide semiconductor via the through holes;
wherein the gate insulating layer separates the gate electrode layer from the P type polysilicon layer of the P type metal oxide semiconductor, the P type polysilicon layer forms a P type front channel when the gate electrode layer of the P type metal oxide semiconductor is subjected to a low voltage;

wherein a level of the second control signal applied to the second light shielding region is controlled to be lower than a level of the first control signal applied to the gate electrode layer by the synchronized voltage pulses in the P type metal oxide semiconductor, if a total thickness of the P type polysilicon layer, the silicon dioxide layer and the silicon nitride layer is less than a thickness of the gate insulating layer;

wherein the level of the second control signal applied to the second light shielding region is controlled to be higher than the level of the first control signal applied to the gate electrode layer by the synchronized voltage pulses in the P type metal oxide semiconductor, if the total thickness of the P type polysilicon layer, the silicon dioxide layer and the silicon nitride layer is greater than the thickness of the gate insulating layer.

4. The control circuit for reducing leakage current of the common gate device according to claim 1, wherein, further comprises:

an organic layer disposed on the P type metal oxide semiconductor and the N type metal oxide semiconductor;

a bottom transparent conductive layer disposed on the organic layer, the organic layer used to isolate the bottom transparent conductive layer from the source/drain electrode;

a protection layer disposed on the organic layer, the bottom transparent conductive layer and an metal layer; and a top transparent conductive layer disposed on the protection layer, the top transparent conductive layer disposed through the protection layer and the organic layer, then electrically connected to the source/drain electrode, the protection layer used to isolate the bottom transparent conductive layer from the top transparent conductive layer.

5. A control circuit for reducing leakage current of a common gate device having a plurality of clock synchronization regions, the control circuit having a multi-clock region control circuit, or a buffer control circuit, comprises:

a substrate;

a silicon nitride layer disposed on the substrate;

a silicon dioxide layer disposed on the silicon nitride layer;

a light shielding layer disposed inside the silicon nitride layer, the light shielding layer comprising a first light shielding region and a second light shielding region;

at least one N type metal oxide semiconductor disposed on the silicon dioxide layer at a position corresponding to the first light shielding region; and at least one P type metal oxide semiconductor disposed on the silicon dioxide layer at a position corresponding to the second light shielding region;

wherein each of the N type metal oxide semiconductor and the P type metal oxide semiconductor has a gate electrode layer, a first control signal received by voltage pulses of the gate electrode layer is synchronized with a second control signal received by the light shielding layer according to voltage variations of the first and second control signals;

wherein the multi-clock region control circuit, comprises:

at least one gate line, each gate line connected the gate electrode a of at least one P type metal oxide semiconductor and the gate electrode layer of at least one N type metal oxide semiconductor in the same clock synchronization region, each gate line transmitting a synchronized first control signal;

at least one light shielding layer control line used to being respectively connected with the first light shielding region of at least one P type metal oxide semiconductor and the second light shielding region of at least one N type metal oxide semiconductor in the same clock synchronization region; and at least one synchronous region light shielding layer control signal generating unit correspondingly connected with the light shielding layer control line in the same clock synchronization region, for generating a second control signal to provide the synchronized second control signal to every light shielding layer control line in the same clock synchronization region;

wherein in the same clock synchronization region, the first control signal of the connected gate electrode layer provided by the gate line, and the second control signal applied to the light shielding layer by the light shielding layer control signal generating unit are synchronized with each other ;

wherein the buffer control circuit, comprises:

a first inverter, the first inverter comprises: the N type metal oxide semiconductor connected the P type metal oxide semiconductor, wherein one end of the first inverter is an input end which is formed by the gate line connected with the gate electrode layer of the N type metal oxide semiconductor and the gate electrode layer of the P type metal oxide semiconductor, the other end of the first inverter is an output end which is formed by the gate line connected with a source/drain electrode of the N type metal oxide semiconductor and the source/drain electrode of the type metal oxide semiconductor;

a second inverter, the second inverter comprises: another the N type metal oxide semiconductor connected to another the P type metal oxide semiconductor, one end of the second inverter being the input end which is formed by the gate line connected with the gate electrode layer of another the N type metal oxide semiconductor and the gate electrode layer of another the P type metal oxide semiconductor, the input end of the second inverter connected the output end of the first inverter, the other end of the second inverter being the output end which is formed by the gate line connected with the source/drain electrode of another N type metal oxide semiconductor and the source/drain electrode of another the P type metal oxide semiconductor;

a first voltage line connected to the first inverter and the second inverter, the first voltage line used to connect with a high voltage source; and a second voltage line connected to the first inverter and the second inverter, the second voltage line used to connect with a low voltage source;

wherein the synchronous region light shielding layer control signal generating unit comprises a first synchronous region signal control generating unit of the first inverter, and a second synchronous region signal control generating unit of the second inverter, the first synchronous region signal control generating unit controlling the second control signal of the light shielding layer of the first inverter, the second synchronous region signal control generating unit controlling the second control signal of the light shielding layer of the second inverter, the first inverter controlled in a first clock synchronization region, the second inverter controlled in a second clock synchronization region, the first synchronous region signal control generating unit connected with the first light shielding region of the P type metal oxide semiconductor of the first inverter and the second light shielding region of the N type metal oxide semiconductor of the first inverter by the light shielding layer control line in the first clock synchronization region, the second synchronous region signal control generating unit connected with the first light shielding region of the P type metal oxide semiconductor of the second inverter and the second light shielding region of the N type metal oxide semiconductor of the second inverter by the other light shielding layer control line in the second clock synchronization region;

in the first clock synchronization region, the first control signal of the gate electrode layer of the first inverter and the second control signal of the first synchronous region signal control generating unit are, controlled to be -voltage pluses that vary synchronously, so as to reduce device leakage current;

in the second clock synchronization region, the first control signal of the gate electrode layer of the second inverter and the second control signal of the second synchronous region signal control generating unit, which are controlled to be voltage pluses varying synchronously, so as to reduce leakage current of the common gate device.

6. The control circuit for reducing leakage current of the common gate device with the plurality of clock synchronization regions according to claim 5, wherein the N type metal oxide semiconductor, comprises:

an N type polysilicon layer disposed on the silicon dioxide layer;

two N- type layers having inner sides thereof respectively joined to both outer sides of the N type polysilicon layer;

two N+ type layers respectively joined to outer sides of the two N- type layers;

a gate insulating layer disposed on the N type polysilicon layer, the two N- type layers, the two N+ type layers and the silicon dioxide layer;

an inner dielectric layer disposed on the gate electrode layer, which is patterned, and the gate insulating layer;

two through holes disposed through the inner dielectric layer and the gate insulating layer; and two source/drain electrodes, respectively connected with the N+ type layers of the N type metal oxide semiconductor via the through holes;

wherein the gate insulating layer separates the gate electrode layer from the N type polysilicon layer of the N type metal oxide semiconductor, the N type polysilicon layer forms a N type front channel when the gate electrode layer of the N type metal oxide semiconductor is subjected to a high voltage;

wherein a level of the second control signal applied to the second light shielding region is controlled to be lower than a level of the first control signal applied to the gate electrode layer by the synchronized voltage pulses in the N type metal oxide semiconductor, if a total thickness of the N type polysilicon layer, the silicon dioxide layer and the silicon nitride layer is less than a thickness of the gate insulating layer;

wherein the level of the second control signal applied to the second light shielding region is controlled to be higher than the level of the first control signal applied to the gate electrode layer by the synchronized voltage pulses in the N type metal oxide semiconductor, if the total thickness of the N type polysilicon layer, the silicon dioxide layer and the silicon nitride layer is greater than the thickness of the gate insulating layer.

7. The control circuit for reducing leakage current of the common gate device with the plurality of clock synchronization regions according to claim 5, wherein the P type metal oxide semiconductor, comprises:

a P type polysilicon layer disposed on the silicon dioxide layer;

two P+ type layers respectively joined to the both outer sides of the P type layer;

a gate insulating layer disposed on the P type poly silicon layer, the two P+ type layers and the silicon dioxide layer;

an inner dielectric layer disposed on the gate electrode layer, which is patterned, and the gate insulating layer;

two through holes disposed through the inner dielectric layer and the gate insulating layer; and two source/drain electrodes, respectively connected with the P+ type layers of the P type metal oxide semiconductor via the through holes;

wherein the gate insulating layer separates the gate electrode layer from the P type polysilicon layer of the P type metal oxide semiconductor, the P type polysilicon layer forms a P type front channel when the gate electrode layer of the P type metal oxide semiconductor is subjected to a low voltage;

wherein a level of the second control signal applied to the second light shielding region is controlled to be lower than a level of the first control signal applied to the gate electrode layer by the synchronized voltage pulses in the P type metal oxide semiconductor, if a total thickness of the P type polysilicon layer, the silicon dioxide layer and the silicon nitride layer is less than a thickness of the gate insulating layer;

wherein the level of the second control signal applied to the second light shielding region is controlled to be higher than the level of the first control signal applied to the gate electrode layer by the synchronized voltage pulses in the P type metal oxide semiconductor, if the total thickness of the P type polysilicon layer, the silicon dioxide layer and the silicon nitride layer is greater than the thickness of the gate insulating layer.

8. The control circuit for reducing leakage current of the common gate device with the plurality of clock synchronization regions according to claim 5, wherein, further comprises:

an organic layer disposed on the P type metal oxide semiconductor and the N type metal oxide semiconductor;

a bottom transparent conductive layer disposed on the organic layer, the organic layer used to isolate the bottom transparent conductive layer from the source/drain electrode;

a protection layer disposed on the organic layer, the bottom transparent conductive layer and an metal layer; and a top transparent conductive layer disposed on the protection layer, the top transparent conductive layer disposed through the protection layer and the organic layer, then electrically connected to the source/drain electrode, the protection layer used to isolate the bottom transparent conductive layer from the top transparent conductive layer.

* * * * *